(12) United States Patent
Zhang et al.

(10) Patent No.: US 12,342,584 B2
(45) Date of Patent: Jun. 24, 2025

(54) THREE-DIMENSIONAL CARRIER STORED TRENCH IGBT AND MANUFACTURING METHOD THEREOF

(71) Applicant: University of Electronic Science and Technology of China, Chengdu (CN)

(72) Inventors: Jinping Zhang, Chengdu (CN); Rongrong Zhu, Chengdu (CN); Yuanyuan Tu, Chengdu (CN); Zehong Li, Chengdu (CN); Bo Zhang, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 634 days.

(21) Appl. No.: 17/752,891

(22) Filed: May 25, 2022

(65) Prior Publication Data
US 2023/0090883 A1 Mar. 23, 2023

(30) Foreign Application Priority Data
Sep. 23, 2021 (CN) .......................... 202111117622.9

(51) Int. Cl.
*H10D 62/10* (2025.01)
*H10D 12/00* (2025.01)
(Continued)

(52) U.S. Cl.
CPC ......... *H10D 62/107* (2025.01); *H10D 12/038* (2025.01); *H10D 12/481* (2025.01);
(Continued)

(58) Field of Classification Search
CPC .. H10D 12/481; H10D 12/038; H10D 62/107; H10D 62/137; H10D 62/127;
(Continued)

(56) References Cited

FOREIGN PATENT DOCUMENTS

| CN | 107731898 A | * | 2/2018 | ......... H01L 27/0255 |
| CN | 110491937 A | * | 11/2019 | |
| CN | 110504310 A | * | 11/2019 | ....... H01L 21/26513 |

OTHER PUBLICATIONS

English Translation (Year: 2019).*
English Translation (Year: 2018).*

* cited by examiner

*Primary Examiner* — Igwe U Anya
(74) *Attorney, Agent, or Firm* — Bayramoglu Law Offices LLC

(57) ABSTRACT

A three-dimensional carrier stored trench IGBT and a manufacturing method thereof are provided. A P-type buried layer and a split gate electrode with equal potential to an emitter metal is introduced on the basis of the traditional carrier stored trench IGBT, which can effectively eliminate the influence of an N-type carrier stored layer on breakdown characteristics of the device through the charge compensation, and at the same time can reduce the on-state voltage drop and improve the trade-off relationship between the on-state voltage drop Vceon and the turn-off loss Eoff. The split gate electrodes is introduced in the Z-axis direction, so that the gate electrodes are distributed at intervals. Therefore, the channel density is reduced. The turning on of the parasitic PMOS has a potential-clamping effect on the NMOS channel, so that the saturation current can be reduced and a wider short-circuit safe operating area (SCSOA) can be obtained.

9 Claims, 9 Drawing Sheets

(51) Int. Cl.
*H10D 12/01* (2025.01)
*H10D 62/13* (2025.01)
*H10D 62/17* (2025.01)
*H10D 84/85* (2025.01)
*H10D 88/00* (2025.01)

(52) U.S. Cl.
CPC ......... *H10D 62/127* (2025.01); *H10D 62/133* (2025.01); *H10D 62/137* (2025.01); *H10D 62/393* (2025.01); *H10D 84/854* (2025.01); *H10D 88/00* (2025.01)

(58) Field of Classification Search
CPC .. H10D 62/133; H10D 62/393; H10D 84/854; H10D 88/00
USPC ........................................................ 257/565
See application file for complete search history.

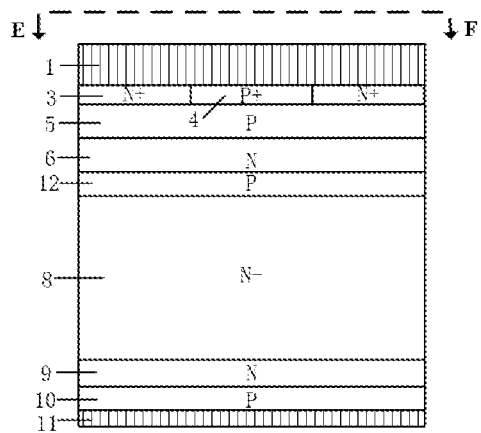
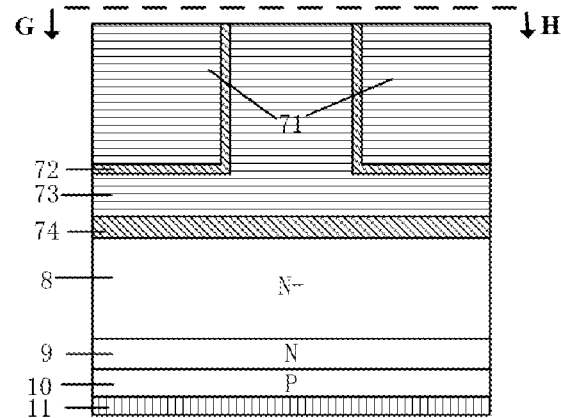
FIG. 5  FIG. 6
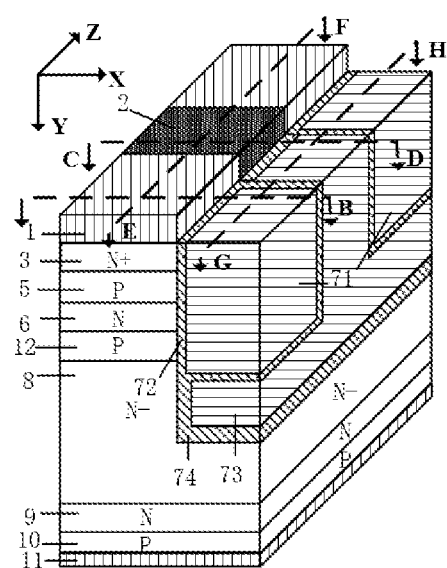
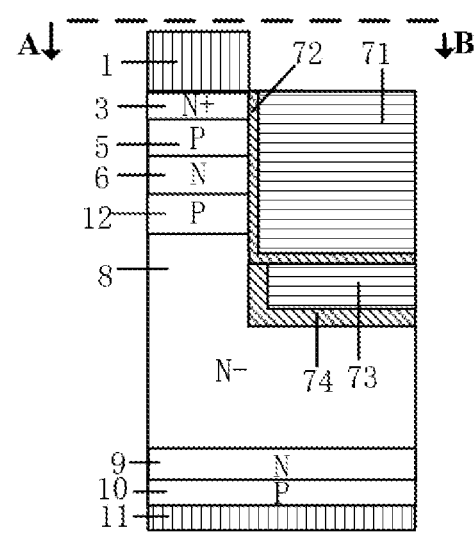
FIG. 7  FIG. 8

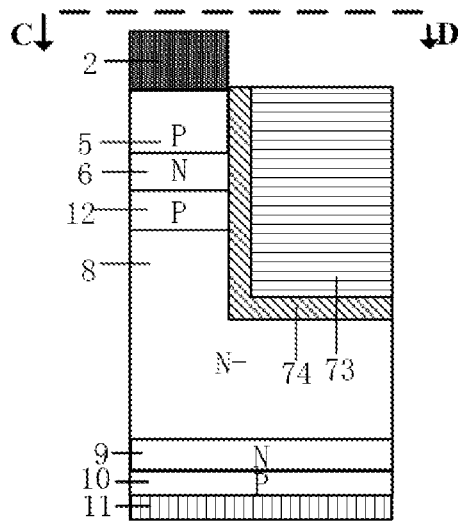
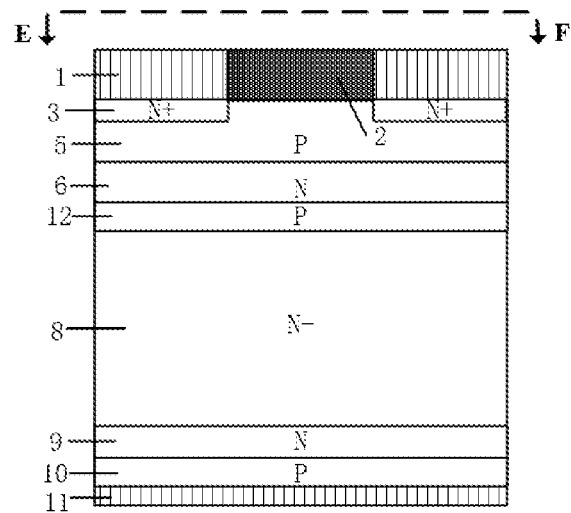
FIG. 9     FIG. 10
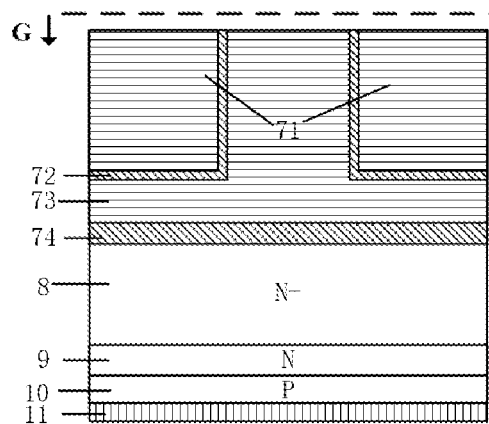
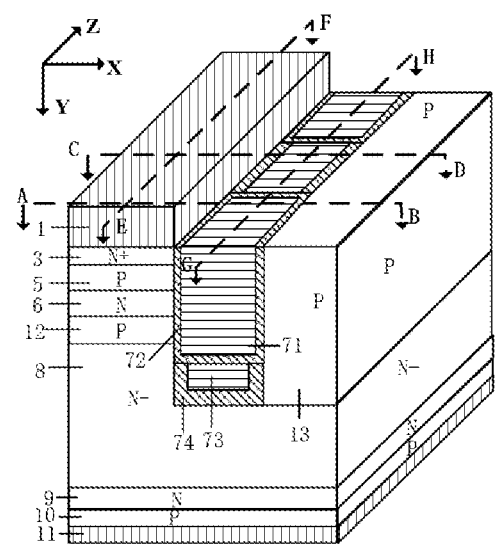
FIG. 11     FIG. 12

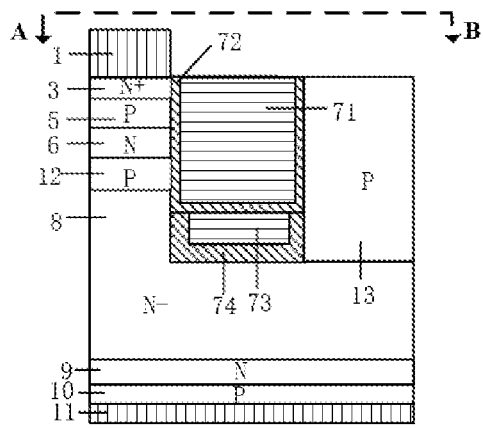
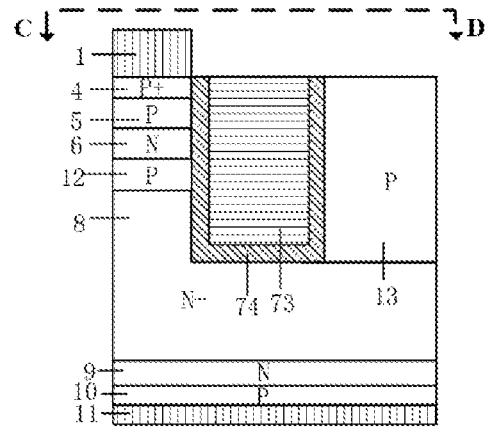
FIG. 13          FIG. 14
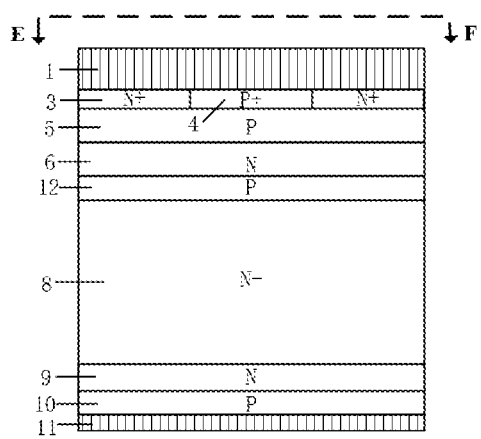
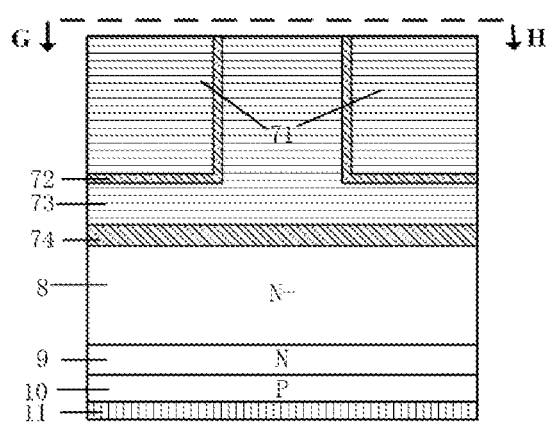
FIG. 15          FIG. 16

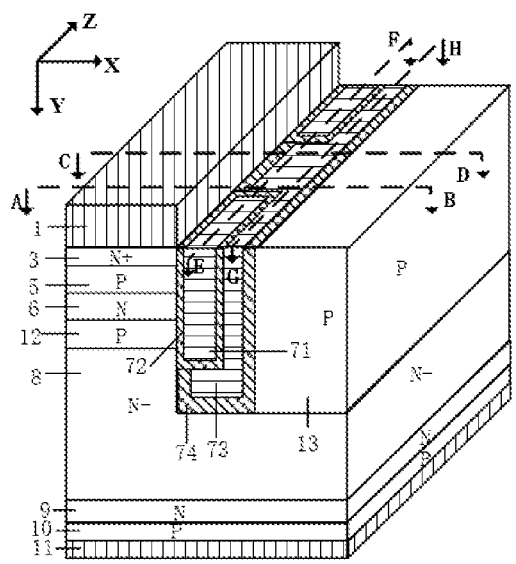
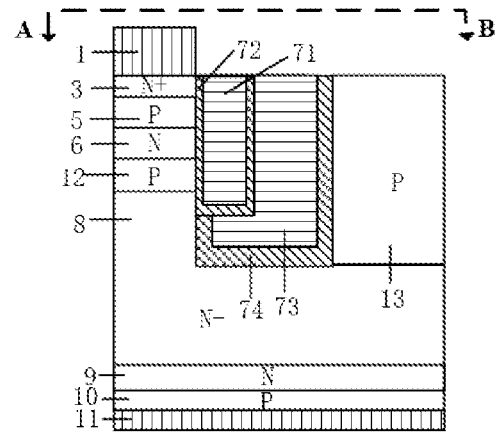
FIG. 17  FIG. 18
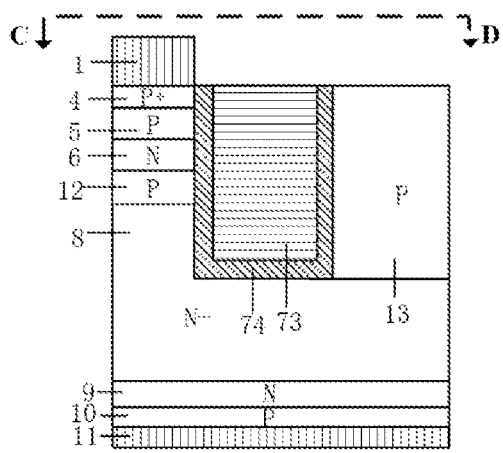
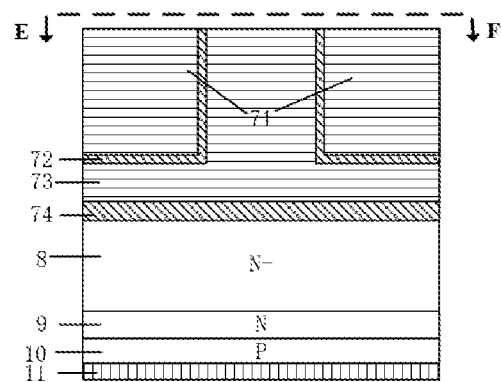
FIG. 19  FIG. 20

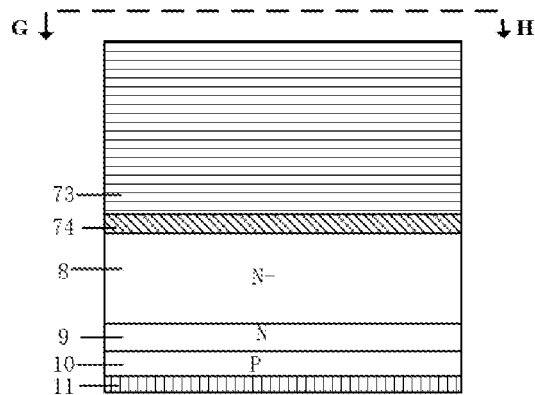
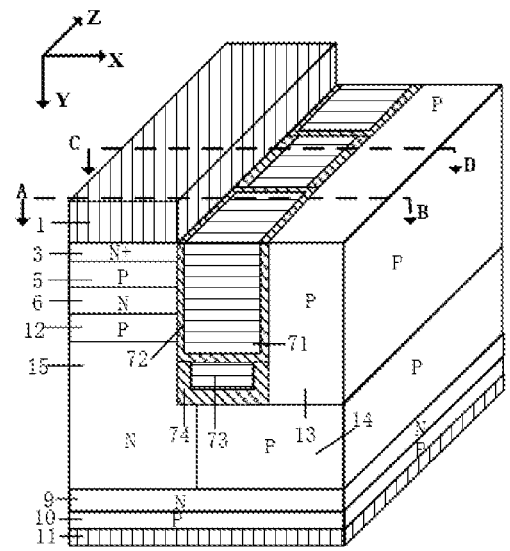
FIG. 21  FIG. 22
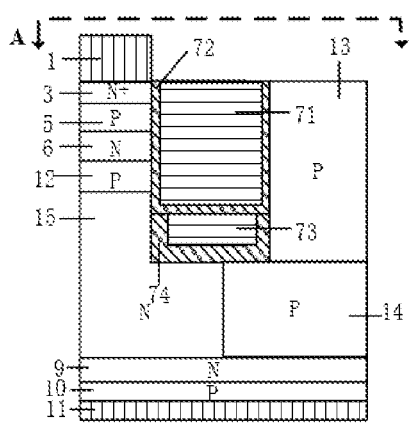
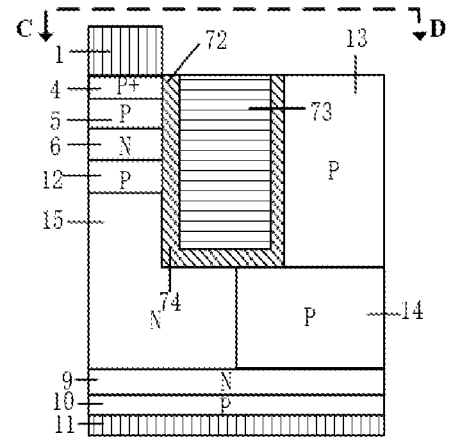
FIG. 23  FIG. 24

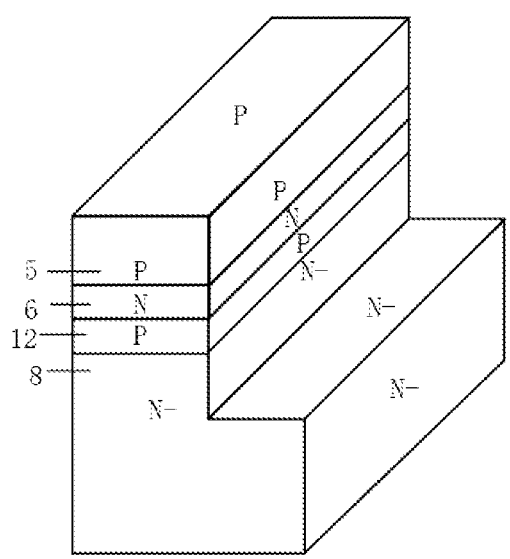
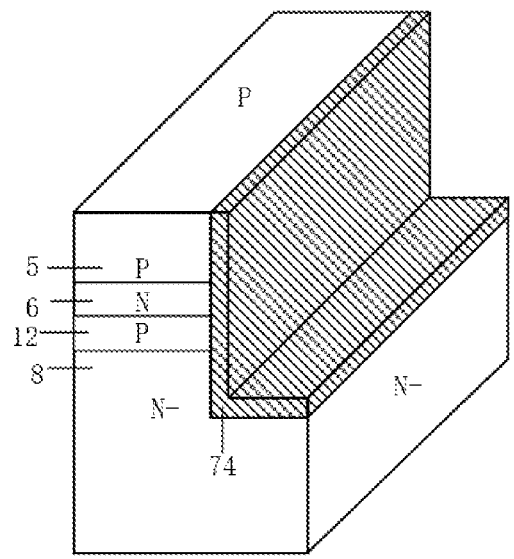
FIG. 25　　　　　　　　FIG. 26
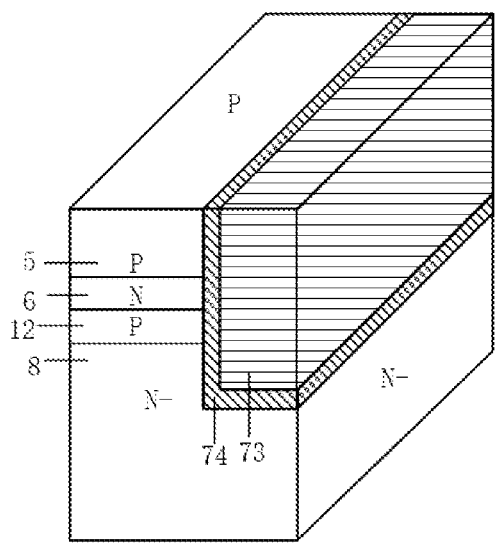
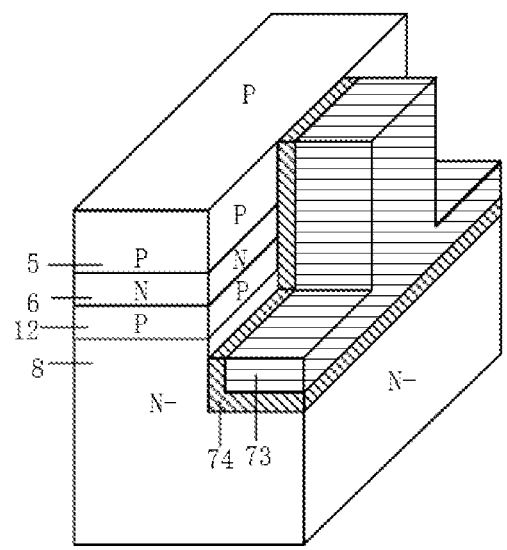
FIG. 27　　　　　　　　FIG. 28

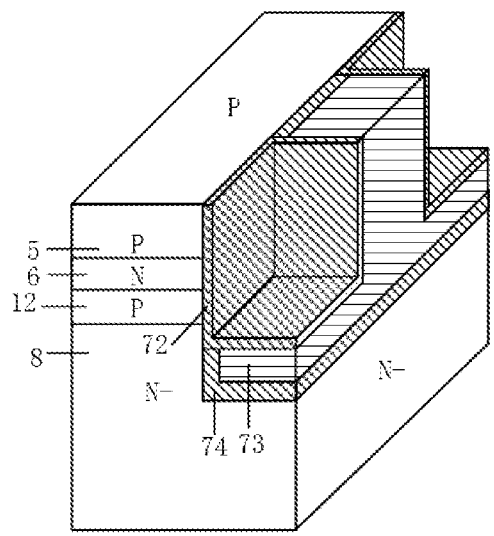 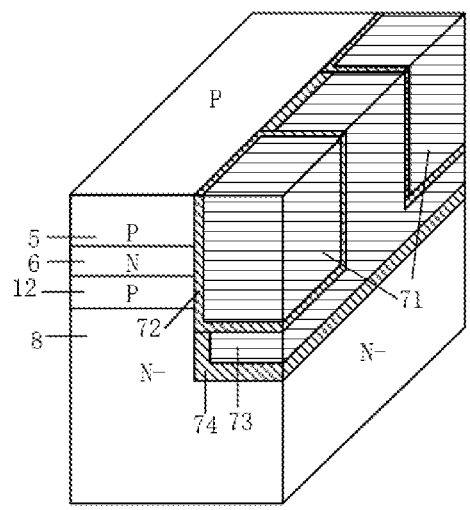
FIG. 29　　　　FIG. 30
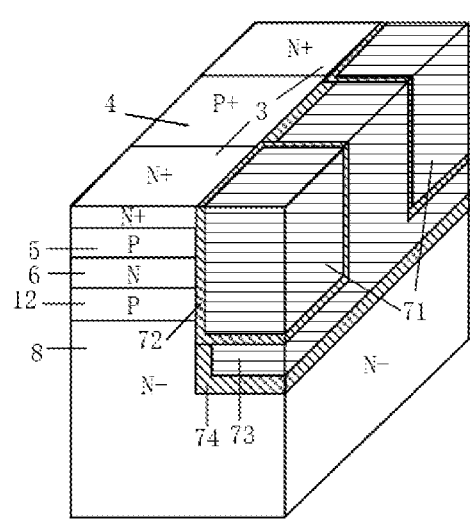 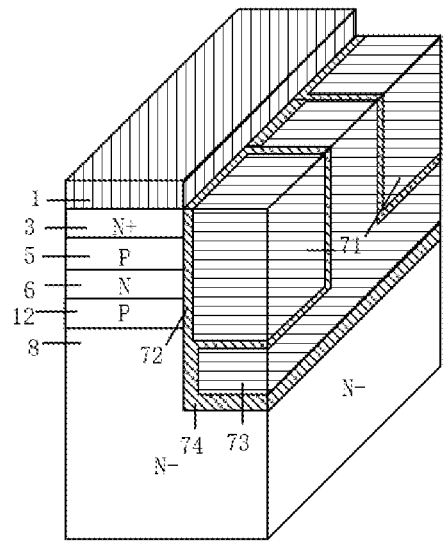
FIG. 31　　　　FIG. 32

THREE-DIMENSIONAL CARRIER STORED TRENCH IGBT AND MANUFACTURING METHOD THEREOF

CROSS REFERENCE TO THE RELATED APPLICATIONS

This application is based upon and claims priority to Chinese Patent Application No. 202111117622.9, filed on Sep. 23, 2021, the entire contents of which are incorporated herein by reference.

TECHNICAL FIELD

The present invention belongs to the technical field of power semiconductor devices, in particular to a three-dimensional carrier stored trench IGBT and a manufacturing method thereof.

BACKGROUND

Insulated gate bipolar transistor (IGBT) is a kind of hybrid power electronic device with the fastest development at present. It has the characteristics of combining MOS and bipolar with MOS input and bipolar output functions. The IGBT not only has the advantages of high input impedance, low control power, simple driving circuit, high switching speed and small switching loss of MOSFET, but also has the advantages of high current density, low on-state voltage drop, strong current processing ability and good stability of BJT. It is incomparable to other power devices in high voltage, high current and high speed, so it is an ideal switching device in the field of power electronics.

Since IGBT was invented in the late 1970s and early 1980s, people have been committed to improving the performance of IGBT. After more than 30 years of development, several generations of IGBT device structures including carrier stored trench bipolar transistor (CSTBT) have been proposed to continuously improve the performance of devices. CSTBT introduces an N-type carrier stored (CS) layer with high doping concentration and certain thickness under the P-type base region. The CS layer acts as a hole barrier, so that the hole concentration near the emitter is greatly increased. And the electron concentration here will also be greatly increased according to the requirement of electric neutrality, which can improve the carrier concentration distribution in the whole N-drift region and enhance a conductance modulation effect in the N-drift region. Therefore, the IGBT can obtain a lower forward on-state voltage drop and a better trade-off between the forward on-state voltage drop and turn-off loss. The higher the doping concentration of the CS layer, the better the conductance modulation effect of CSTBT, and the better the forward conduction characteristics of the device. However, with the increasing doping concentration of the CS layer, the breakdown voltage of the CSTBT device will decrease significantly, which will affect the reliability of the device. In addition, for the trench IGBT, in order to improve the ability of IGBT to process current and improve chip integration, the cell width and the spacing between trenches are continuously reduced. However, with the increase of channel density, the capacitance will increase obviously, and the switching loss of IGBT will also increase. At the same time, the large channel density will leads to the poor short-circuit safe operation area (SCSOA) of IGBT.

SUMMARY

In view of the above, the present invention aims at the problems existing in the prior art, and provides a three-dimensional carrier stored trench IGBT and a manufacturing method thereof. The new structure can not only overcome the degradation of breakdown characteristics of CSTBT caused by introduction of the carrier stored layer. Meanwhile, the new structure can also reduce the adverse effects of large saturation current and gate capacitance caused by large trench density and small cell width.

In order to achieve the above objective, the technical solution of the present invention is as follows.

Wherein three-dimensional directions of the device are defined in the three-dimensional rectangular coordinate system as follows: the transverse direction of the device is defined as the X-axis direction, the vertical direction of the device is defined as the Y-axis direction, and the third dimensional direction, i.e., the direction perpendicular to both the X-axis and the Y-axis, is defined as the Z-axis direction. A cell structure of the present invention includes a back collector metal 11, a P-type collector region 10, an N-type field stop layer 9 and an N-drift region 8 stacked in an order from bottom to top in the Y-axis direction. A P-type buried layer 12 and a trench structure in side contact with each other along the X-axis direction provided at the top layer of the N-drift region 8. An N-type carrier stored layer 6 and a P-type base region 5 stacked in an order from bottom to top provided at the top layer of the P-type buried layer 12 in the Y-axis direction. An N+ emitter region 3 and a P+ emitter region 4 in side contact with each other along the Z-axis direction provided at the top layer of the P-type base region 5, and the N+ emitter region 3 and the P+ emitter region 4 distributed alternately.

In the Y-axis direction, the depth of the trench structure is greater than the junction depth of the P-type buried layer 12. And the trench structure includes gate electrodes 71, gate dielectric layers 72, a split gate electrode 73, and a split gate dielectric layer 74. In the Z-axis direction, the gate electrodes 71 are distributed at intervals, and there is the split gate electrode between the two adjacent gate electrodes 71. Moreover, along the Z-axis direction, the length of the gate electrode 71 is less than or equal to the length of the split gate electrode 73 between adjacent gate electrodes 71. In the Y-axis direction, the depth of the gate electrode 71 is greater than the junction depth of the P-type buried layer 12 and less than the depth of the lower surface of the split gate electrode 73. So the lower side of the gate electrode 71 has the split gate electrode 73, and the gate electrode 71 and the split gate electrode 73 are isolated by the gate dielectric layer 72. The gate electrode 71 is connected to the N+ emitter region 3, the P-type base region 5, the N-type carrier stored layer 6, the P-type buried layer 12 and the N-drift region 8 through the gate dielectric layer 72. The depth of the lower surface of the split gate electrode 73 is greater than the junction depth of the P-type buried layer 12; the split gate electrode 73 is connected to the P+ emitter region 4, the P-type base region 5, the N-type carrier stored layer 6, the P-type buried layer 12 and the N-drift region 8 through the split gate dielectric layer 74. The split gate dielectric layer 74 has a thickness greater than or equal to the gate dielectric layer 72. And an emitter metal 1 is on the upper surfaces of the N+ emitter region 3 and the P+ emitter region 4. And the split gate electrode 73 has the equal potential with the emitter metal 1.

Another cell structure of the present invention includes a back collector metal 11, a P-type collector region 10, an N-type field stop layer 9 and an N-drift region 8 stacked in an order from bottom to top in the Y-axis direction. A P-type buried layer 12 and a trench structure in side contact with each other along the X-axis direction provided at a top layer of the N-drift region 8. An N-type carrier stored layer 6 and a P-type base region 5 stacked in an order from bottom to top provided at a top layer of the P-type buried layer 12 in the Y-axis direction. In the Z-axis direction, N+ emitter regions 3 distributed at intervals provided at a top layer of the P-type base region 5. There is the P-type base region 5 between adjacent N+ emitter regions 3, and upper surfaces of the N+ emitter regions 3 and the P-type base region 5 is flush.

In the Y-axis direction, the depth of the trench structure is greater than the junction depth of the P-type buried layer 12. And the trench structure includes gate electrodes 71, gate dielectric layers 72, a split gate electrode 73, and a split gate dielectric layer 74. In the Z-axis direction, the gate electrodes 71 are distributed at intervals, and there is the split gate electrode 73 between the two adjacent gate electrodes 71. Moreover, along the Z-axis direction, the length of the gate electrode 71 is less than or equal to the length of the split gate electrode 73 between adjacent gate electrodes 71. In the Y-axis direction, the depth of a lower surface of the gate electrode 71 is greater than the junction depth of the P-type buried layer 12 and less than the depth of the lower surface of the split gate electrode 73. So the lower side of the gate electrode 71 has the split gate electrode 73, and the gate electrode 71 and the split gate electrode 73 are isolated by the gate dielectric layer 72. The gate electrode 71 is connected to the N+ emitter region 3, the P-type base region 5, the N-type carrier stored layer 6, the P-type buried layer 12 and the N-drift region 8 through the gate dielectric layer 72. The depth of a lower surface of the split gate electrode 73 is greater than the junction depth of the P-type buried layer 12, and the split gate electrode 73 is connected to the P-type base region 5, the N-type carrier stored layer 6, the P-type buried layer 12 and the N-drift region 8 through the split gate dielectric layer 74. The split gate dielectric layer 74 has a thickness greater than or equal to the gate dielectric layer 72. And an emitter metal 1 is on the upper surfaces of the N+ emitter region 3 and a schottky contact metal 2 is on the P-type base region 5 between adjacent N+ emitter regions 3. And the split gate electrode 73 and the schottky contact metal 2 has the equal potential with the emitter metal 1.

On the basis of the technical solution, the present invention can also be improved as follows.

Further, the IGBT further includes a floating P-type region 13. Along the X-axis direction, the floating P-type region 13 is located at one side of the trench structure. And the floating P-type region 13 is isolated from the gate electrode 71 by the gate dielectric layer 72 and from the split gate electrode 73 by the split gate dielectric layer 74.

Further, in the Y-axis direction, the depth of the lower surface of the floating P-type region 13 is equal to or greater than the depth of the trench structure.

Further, along the X-axis direction, the width of the gate electrode 71 plus the gate dielectric layer 72 is smaller than the width of the trench structure. Therefore, split gate electrode 73 is provided between the gate dielectric layer 72 and the floating P-type region 13. And the split gate electrode 73 is connected to the floating P-type region 13 through the split gate dielectric layer 74.

Further, the doping concentration of the N-type carrier stored layer 6 varies gradually from the region close to the trench structure to the region away from the trench structure. Wherein the doping concentration is low in the region close to the trench structure and high in the region away from the trench structure.

Further, the gradual change of the doping concentration of the N-type carrier stored layer 6 is achieved by adopting a variable doping technique or a partition doping technique.

Further, the bottom of the trench structure is further provided with a P-type layer 16.

Further, the N-drift region 8 has a super junction P-pillar 14 and a super junction N-pillar 15 in side contact with each other along X-axis direction. And the super junction P-pillar 14 and the super junction N-pillar 15 meet charge balance requirements. A part of the trench structure and the P-type buried layer 12 are located on the super junction N-pillar 15, and the other part of the trench structure and the floating P-type region 13 are located on the super junction P-pillar 14.

Further, the semiconductor material used in the device is any one or more of Si, SiC, GaAs, GaN, $Ga_2O_3$, MN and diamond.

Further, the device structure is not only suitable for IGBT devices, but also suitable for MOSFET devices by replacing the P-type collector region 10 on a back surface of the device with an N-type doping.

To solve the above technical problems, embodiments of the present invention provide a manufacturing method of the three-dimensional trench carrier stored IGBT, the method includes:

step 1: selecting a lightly doped FZ (Float Zone) silicon wafer to form an N-drift region 8 of the device;

step 2: growing a layer of field oxide layer on a surface of the FZ silicon chip, resulting in an active region by photoetching, then growing a layer of pre-oxide layer, making a P-type buried layer 12 by ion implantation of P-type impurities above the N-drift region 8; making an N-type carrier stored layer 6 by ion implantation of N-type impurities on the upper surface of the P-type buried layer 12; and making a P-type base region 5 by ion implantation of the P-type impurities on the upper surface of the N-type carrier stored layer 6 and an annealing treatment;

step 3: depositing a protective layer on the surface of the silicon wafer, photoetching a window to carry out trench silicon etching, thereby etching and forming a split gate trench on one side of the top layer of the N-drift region 8 in the X-axis direction, wherein the depth of the split gate trench is greater than the junction depth of the P-type buried layer 12;

step 4: forming split gate dielectric layers 74 on a bottom and side walls of the split gate trench, and then depositing polysilicon on the split gate dielectric layers 74 to form split gate electrodes 73;

step 5: depositing the protective layer on the surface of the silicon wafer, photoetching a window, and etching part of the polysilicon and the split gate dielectric layer, so as to form gate trenches distributed at intervals on top layers of the split gate trenches along the Z-axis direction, wherein the split gate electrodes 73 are provided between the gate trenches, and depths of the gate trenches are greater than the junction depth of the P-type buried layer 12;

step 6: forming gate dielectric layers 72 on a bottom and side walls of the gate trench, depositing polysilicon on the gate dielectric layers 72 to form gate electrodes 71, wherein the gate electrodes 71 are isolated from the split gate electrode 73 by the gate dielectric layers 72, and the thickness of each of the gate dielectric layer 72 is less than or equal to the thickness of each of the split gate dielectric layer 74;

step 7: implanting the N-type impurities and the P-type impurities on the top layer of the P-type base region 5 through photoetching and ion implantation processes, respectively, so as to form N+ emitter regions 3 and a P+ emitter region 4 which are alternately arranged side by side and contact with each other on the top layer of the P-type base region 5 in the Z-axis direction; wherein in the X-axis direction, one side of the N+ emitter region 3 is connected to the gate electrode 71 through the gate dielectric layer 72, and one side of the P+ emitter region 4 is connected to the split gate electrode 73 through the split gate dielectric layer 74;

step 8: depositing a metal on a surface of the device, and forming an emitter metal 1 on the N+ emitter region 3 and the P+ emitter region 4 by using photoetching and etching processes;

step 9: flipping the silicon wafer, reducing the thickness of the silicon wafer, making an N-type field stop layer 9 of the device through implanting the N-type impurities into the back surface of the silicon wafer and performing multiple laser annealing;

step 10: forming a P-type collector region 10 by implanting the P-type impurities on a back surface of the N-type field stop layer 9, and performing ion activation through laser annealing; then depositing a metal on the back surface of the P-type collector region to form a collector metal 11.

Further, the thickness of the FZ silicon chip is 200 to 300 μm, or the thickness of the split gate dielectric layer 74 is 0.1 to 0.5 μm, or the thickness of the gate dielectric layer 72 is 0.1 to 0.3 μm, the thickness of the emitter metal 1 is 1 to 6 μm, or the thickness of the N-type field stop layer is 1 to 5 μm, or the thickness of the P-type collector region is 0.5 to 2 μm, or the thickness of the collector metal 11 is 1 to 6 μm.

Further, the doping concentration of the N-drift region 8 is $10^{14}$ to $10^{15}/cm^3$, or the doping concentration of the P-type buried layer 12 is $10^{15}$ to $10^{16}/cm^3$, or the doping concentration of the N-type charge storage layer 6 is $10^{15}$ to $10^{17}/cm^3$, or the doping concentration of the P-type base region 5 is $10^{16}$ to $10^{17}/cm^3$.

Further, an order of forming the trench structure and forming the P-type buried layer 12, the N-type carrier stored layer 6, the P-type base region 5 is interchangeable.

Further, the semiconductor material used in the device is any one or more of Si, SiC, GaAs, GaN, $Ga_2O_3$, AlN and diamond, and each structure can be made of the same semiconductor material or a combination of different semiconductor materials.

The working principle of the present invention is described in detail as follows:

In order to eliminate the influence of the doping concentration of the N-type carrier stored layer on the breakdown characteristics of the device, and simultaneously reduce the adverse effects of large saturation current and gate capacitance caused by the small cell width. In the present invention, based on the traditional carrier stored trench IGBT, the split gate electrode 73 with equal potential to the emitter metal is introduced at the bottom and the side wall along the Z-axis direction of the gate electrode 71, and the P-type buried layer 12 is introduced below the N-type carrier stored layer. When the device operates in the blocked state, the PN junction between the P-type buried layer 12 and the N-drift region 8 is reverse biased so that the drift region 8 to be completely depleted before the N-type carrier stored layer 6 is depleted, thereby shielding the high electric field brought by the highly doped carrier stored layer. In addition, the split gate electrode 73 is connected with the emitter metal 1 at a low potential, which is equivalent to providing negatively charged charges, thereby forming a charge compensation to effectively shield the electric field of the charge storage layer, and further eliminating the limitation of the doping concentration of the carrier stored layer on the breakdown characteristics of the device. Moreover, the thick split gate dielectric layer 74 at the bottom of the trench is beneficial to alleviate the electric field concentration effect at the bottom of the trench and further improve the breakdown voltage of the devices. When the device operates in the on-state, the carrier distribution of the N-drift region can be improved by increasing the doping concentration of the carrier stored layer 6, so that the conductance modulation ability of the N-drift region 8 is improved. Therefore, the forward on-state voltage drop and the on-state loss of the device is reduced, and the trade-off relationship between the forward on-state voltage drop Vceon and the turn-off loss Eoff of the device is improved.

In addition, the gate electrode and the split gate electrode are located in the same trench, and the gate electrode 71 and the split gate electrode 73 are arranged at intervals in the Z-axis direction above the trench. This can effectively reduce the channel density of the whole chip. And a parasitic PMOS structure can be formed by the split gate electrode between two adjacent gate electrodes, the P-type base region 5, the P+ emitter region 4, the N-type carrier stored layer 6 and the P-type buried layer 12. When the device is conducting forwardly, the potential of the P-type buried layer 12 and the N-type charge storage layer 6 increases with the increase of the forward bias applied to the collector. However, when the potential of the P-type buried layer 12 increases to a certain value, PMOS will be turned on. Therefore, the P-type buried layer 12 and the N-type carrier stored layer 6 are equivalent to being connected to the emitter. So the potential of the P-type buried layer 12 and the N-type carrier stored layer 6 will no longer increase with the increase of the collector voltage. And part of the gate-collector capacitance can be converted into the gate-emitter capacitance, which effectively reduces the gate-collector capacitance. At the same time, the gate electrode 71 is enclosed by the split gate electrode 73, so that the coupling between the gate electrode and the N-drift region is suppressed, which can further reduce the gate capacitance, especially the gate-collector capacitance, improve the switching speed of the device, and reduce the turn-off loss. The gate charge of the device can be reduced while the gate capacitance is reduced, which makes the device easy to be driven, reduces the requirements of driving ability and reduces the driving loss. Under short-circuit conditions, the reduced channel density and the clamped the potential of the P-type buried layer and the N-type carrier stored layer result in the lower saturation current density of the device, thereby resulting in a wide short-circuit safe operating area (SCSOA). In addition, since the gate electrode 71 and the split gate electrode 73 are located in the same trench, the distance between the parasitic PMOS and the NMOS channel is reduced, so the clamping effect of the PMOS is improved, and the current uniformity inside the chip can be improved, thereby improving the reliability and reverse bias safe operating area (RBSOA) of the device.

The present invention has the advantages that:

By introducing the split gate electrode and the P-type buried layer on the basis of the traditional trench charge storage IGBT, the present invention can effectively eliminate the adverse influence of the N-type carrier stored layer on the breakdown characteristics of the device. It can not only improve the breakdown voltage and reliability of the device, but also improve the carrier distribution in the drift region during forward conduction, thereby improving the trade-off relationship between the forward on-state voltage drop Vceon and the turn-off loss Eoff.

The present invention introduces the split gate electrodes into the gate electrodes in the Z-axis direction, so that the gate electrodes are arranged at interval in the Z-axis direction. This can not only reduce the channel density inside the chip, but also form a parasitic PMOS structure at the same time. The turning on of the parasitic PMOS has a potential-clamping effect on the NMOS channel, thereby reducing the saturation current and obtaining a wider short-circuit safe operating area (SCSOA). In addition, the present invention significantly reduces the gate capacitance and the gate charge through the clamping of the PMOS and the shielding action of the split gate electrode at the bottom of the gate electrode. Moreover, the PMOS can accelerate the extraction of holes during the turn-off process, thereby improving the switching speed of the device, reducing the switching loss of the device and the requirement on the capability of the gate driving circuit. Since the parasitic PMOS is present in each cell and the distance between the parasitic PMOS and the NMOS channel is shortened, it is beneficial to improve the clamping effect of PMOS and the current uniformity inside the chip, which obtain high reliability and wide reverse bias safe operating area (RBSOA).

BRIEF DESCRIPTION OF THE DRAWINGS

FIG. 5 is a cross-sectional schematic diagram of the half cell structure of the three-dimensional carrier stored trench IGBT provided in embodiment 1 of the present invention along an EF line;

FIG. 6 is a cross-sectional schematic diagram of the half cell structure of the three-dimensional carrier stored trench IGBT provided in embodiment 1 of the present invention along a GH line;

FIG. 7 is a half cell structure diagram of a three-dimensional carrier stored trench IGBT provided in embodiment 2 of the present invention;

FIG. 8 is a cross-sectional schematic diagram of the half cell structure of the three-dimensional carrier stored trench IGBT provided in embodiment 2 of the present invention along an AB line;

FIG. 9 is a cross-sectional schematic diagram of the half cell structure of the three-dimensional carrier stored trench IGBT provided in embodiment 2 of the present invention along a CD line;

FIG. 10 is a cross-sectional schematic diagram of the half cell structure of the three-dimensional carrier stored trench IGBT provided in embodiment 2 of the present invention along an EF line;

FIG. 11 is a cross-sectional schematic diagram of the half cell structure of the three-dimensional carrier stored trench IGBT provided in embodiment 2 of the present invention along a GH line;

FIG. 12 is a half cell structure diagram of a three-dimensional carrier stored trench IGBT provided in embodiment 3 of the present invention;

FIG. 13 is a cross-sectional schematic diagram of the half cell structure of the three-dimensional carrier stored trench IGBT provided in embodiment 3 of the present invention along an AB line;

FIG. 14 is a cross-sectional schematic diagram of the half cell structure of the three-dimensional carrier stored trench IGBT provided in embodiment 3 of the present invention along a CD line;

FIG. 15 is a cross-sectional schematic diagram of the half cell structure of the three-dimensional carrier stored trench IGBT provided in embodiment 3 of the present invention along an EF line;

FIG. 16 is a cross-sectional schematic diagram of the half cell structure of the three-dimensional carrier stored trench IGBT provided in embodiment 3 of the present invention along a GH line;

FIG. 17 is a half cell structure diagram of a three-dimensional carrier stored trench IGBT provided in embodiment 4 of the present invention;

FIG. 18 is a cross-sectional schematic diagram of the half cell structure of the three-dimensional carrier stored trench IGBT provided in embodiment 4 of the present invention along an AB line;

FIG. 19 is a cross-sectional schematic diagram of the half cell structure of the three-dimensional carrier stored trench IGBT provided in embodiment 4 of the present invention along a CD line;

FIG. 20 is a cross-sectional schematic diagram of the half cell structure of the three-dimensional carrier stored trench IGBT provided in embodiment 4 of the present invention along an EF line;

FIG. 21 is a cross-sectional schematic diagram of the half cell structure of the three-dimensional carrier stored trench IGBT provided in embodiment 4 of the present invention along a GH line;

FIG. 22 is a half cell structure diagram of a three-dimensional carrier stored trench IGBT provided in embodiment 5 of the present invention;

FIG. 23 is a cross-sectional schematic diagram of the half cell structure of the three-dimensional carrier stored trench IGBT provided in embodiment 5 of the present invention along an AB line;

FIG. 24 is a cross-sectional schematic diagram of the half cell structure of the three-dimensional carrier stored trench IGBT provided in embodiment 5 of the present invention along a CD line;

FIG. 25 is a half cell structure diagram of a three-dimensional carrier stored trench IGBT provided in embodiment 6 of the present invention after forming a split gate trench;

FIG. 26 is a half cell structure diagram of the three-dimensional carrier stored trench IGBT provided in embodiment 6 of the present invention after forming a split gate dielectric layer 74;

FIG. 27 is a half cell structure diagram of the three-dimensional carrier stored trench IGBT provided in embodiment 6 of the present invention after forming a split gate electrode 73;

FIG. 28 is a half cell structure diagram of the three-dimensional carrier stored trench IGBT provided in embodiment 6 of the present invention after etching polysilicon and dielectric layers to form a gate trench in the split gate electrode;

FIG. 29 is a half cell structure diagram of the three-dimensional carrier stored trench IGBT provided in embodiment 6 of the present invention after forming a gate dielectric layer 72;

FIG. 30 is a half cell structure diagram of the three-dimensional carrier stored trench IGBT provided in embodiment 6 of the present invention after forming gate electrodes 71;

FIG. 31 is a half cell structure diagram of a three-dimensional carrier stored trench IGBT provided in embodiment 6 of the present invention after forming an N+ emitter region 3 and a P+ emitter region 4;

FIG. 32 is a half cell structure diagram of the three-dimensional carrier stored trench IGBT provided in embodiment 6 of the present invention after forming an emitter metal 1 on upper surface of the N+ emitter region 3 and the P+ emitter region 4.

Figure 1:
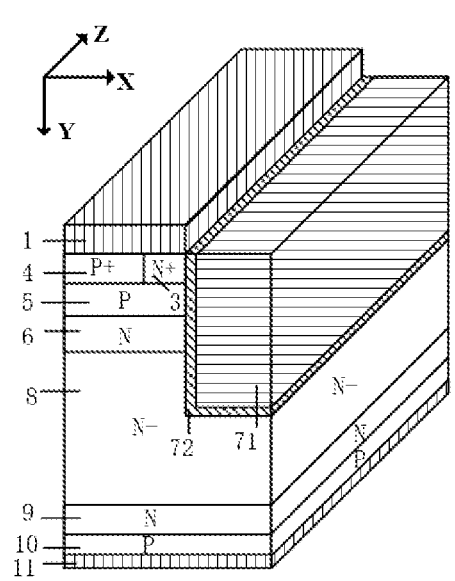
FIG. 1 is a schematic diagram of a half cell structure of the traditional three-dimensional carrier stored trench IGBT device.
Figure 2:
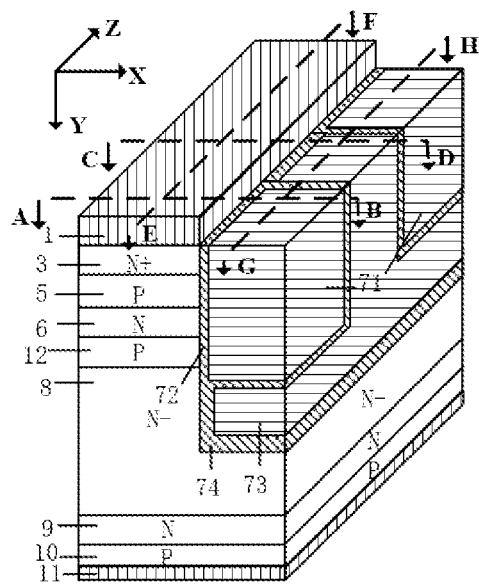
FIG. 2 is a half cell structure diagram of the three-dimensional carrier stored trench IGBT provided in embodiment 1 of the present invention.
Figure 3:
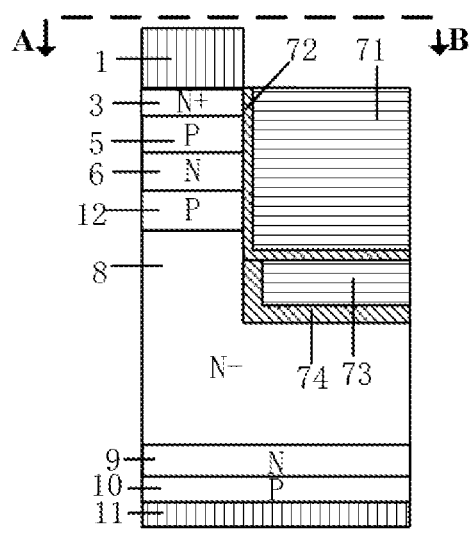
FIG. 3 is a cross-sectional schematic diagram of the half cell structure of the three-dimensional carrier stored trench IGBT provided in embodiment 1 of the present invention along an AB line.
Figure 4:
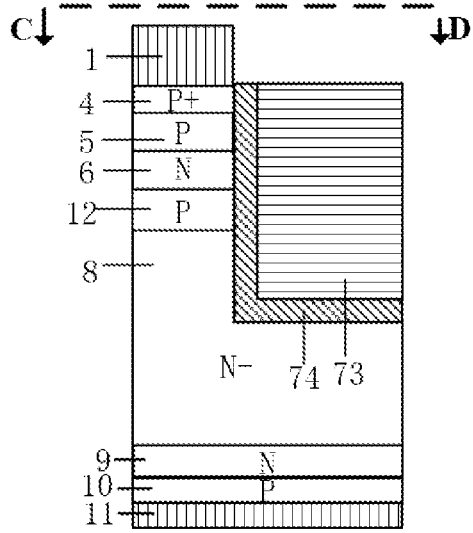
FIG. 4 is a cross-sectional schematic diagram of the half cell structure of the three-dimensional carrier stored trench IGBT provided in embodiment 1 of the present invention along a CD line.

In the drawings, the parts represented by reference signs are listed as follows:

1 is emitter metal, 2 is Schottky contact metal, 3 is N+ emitter region, 4 is P+ emitter region, 5 is P-type base region, 6 is N-type carrier stored layer, 71 is gate electrode, 72 is gate dielectric layer, 73 is split gate electrode, 74 is split gate dielectric layer, 8 is N-drift region, 9 is N-type field stop layer, 10 is P-type collector region, 11 is collector metal, 12 is P-type buried layer, 13 is floating P-type region, 14 is super junction P-pillar and 15 is super junction N-pillar.

DETAILED DESCRIPTION OF THE EMBODIMENTS

The principles and features of the present invention are described below in conjunction with the accompanying drawings, and the examples given are intended to explain the present invention only and are not intended to limit the scope of the present invention.

Embodiment 1 of the present invention provides a three-dimensional carrier stored trench IGBT, its half cell structure and sections along AB line, CD line, EF line and GH line are shown in FIGS. 2-6. Wherein three-dimensional directions of the device are defined in a three-dimensional rectangular coordinate system as follows: the transverse direction of the device is defined as the X-axis direction, the vertical direction of the device is defined as the Y-axis direction, and the third dimensional direction, i.e., the direction perpendicular to both the X-axis and the Y-axis, is defined as the Z-axis direction. The cell structure of the device includes a back collector metal 11, a P-type collector region 10, an N-type field stop layer 9 and an N-drift region 8 stacked in an order from bottom to top in the Y-axis direction. A P-type buried layer 12 and a trench structure in side contact with each other along the X-axis direction provided at the top layer of the N-drift region 8. An N-type carrier stored layer 6 and a P-type base region 5 stacked in an order from bottom to top provided at a top layer of the P-type buried layer 12 in the Y-axis direction. An N+ emitter region 3 and a P+ emitter region 4 in side contact with each other along the Z-axis direction provided at the top layer of the P-type base region 5, and the N+ emitter region 3 and the P+ emitter region 4 distributed alternately;

In the Y-axis direction, the depth of the trench structure is greater than the junction depth of the P-type buried layer 12.

And the trench structure includes gate electrodes 71, gate dielectric layers 72, a split gate electrode 73, and a split gate dielectric layer 74. In the Z-axis direction, the gate electrodes 71 are distributed at intervals, and there is the split gate electrode between the two adjacent gate electrodes 71. Moreover, along the Z-axis direction, the length of the gate electrode 71 is less than or equal to the length of the split gate electrode 73 between adjacent gate electrodes 71. In the Y-axis direction, and the depth of a lower surface of the gate electrode 71 is greater than the junction depth of the P-type buried layer 12 and less than the depth of the lower surface of the split gate electrode 73. So the lower side of the gate electrode 71 has the split gate electrode 73, and the gate electrode 71 and the split gate electrode 73 are isolated by the gate dielectric layer 72. The gate electrode 71 is connected to the N+ emitter region 3, the P-type base region 5, the N-type carrier stored layer 6, the P-type buried layer 12 and the N-drift region 8 through the gate dielectric layer 72. The depth of the lower surface of the split gate electrode 73 is greater than the junction depth of the P-type buried layer 12; the split gate electrode 73 is connected to the P+ emitter region 4, the P-type base region 5, the N-type carrier stored layer 6, the P-type buried layer 12 and the N-drift region 8 through the split gate dielectric layer 74. The split gate dielectric layer 74 has a thickness greater than or equal to the gate dielectric layer 72. And an emitter metal 1 is on the upper surfaces of the N+ emitter region 3 and the P+ emitter region 4. And the split gate electrode 73 has the equal potential with the emitter metal 1

The semiconductor material used in the above embodiment is silicon, and any suitable semiconductor material such as silicon carbide, gallium nitride and the like can also be used. In this embodiment, the metallized electrodes (emitter metal and collector metal) has the thickness of 1 to 6 μm; the N+ emitter region 3 has the doping concentration of $5 \times 10^{18}$ cm$^{-3}$ to $1 \times 10^{20}$ cm$^{-3}$ and the depth of 0.3 to 0.5 μm; the P+ emitter region 4 has the doping concentration of $1 \times 10^{18}$ cm$^{-3}$ to $1 \times 10^{19}$ cm$^{-3}$ and the depth of 0.3 to 0.5 μm; the P-type base 5 has the doping concentration of $3 \times 10^{16}$ cm$^{-3}$ to $2 \times 10^{17}$ cm$^{-3}$ and the depth of 1 to 2.5 μm; the N-type carrier stored layer 6 has the doping concentration of $1 \times 10^{16}$ cm$^{-3}$ to $5 \times 10^{17}$ cm$^{-3}$ and the depth of 1 to 2.5 μm; the P-type buried layer 12 has the doping concentration of $1 \times 10^{16}$ cm$^{-3}$ to $5 \times 10^{18}$ cm$^{-3}$ and the depth of 0.5 to 1.5 μm; the N-type drift region 8 has the doping concentration of $2 \times 10^{14}$ cm$^{-3}$ to $1 \times 10^{16}$ cm$^{-3}$; the split gate dielectric layer 74 has the thickness of 0.2 to 3 μm; the gate dielectric layer 72 has the thickness of 100 to 1000 nm; the gate electrode has the depth of 3 to 5 μm; and the split gate electrode 73 has the depth of 5 to 7 μm. The gate electrode 71 has the length in the Z-axis direction of 0.5 to 2 μm; and the split gate electrode 73 located between two adjacent gate electrodes 71 has the length in the Z-axis direction of 0.5 to 5 μm.

In this embodiment, the trench structure can penetrate through the N+ emitter region 3, the P+ emitter region 4, the P-type base region 5, the N-type carrier stored layer 6 and the P-type buried layer 12 from the surface of the device downward in sequence and then extend into the N-drift region 8, and the trench structure can penetrate through the device in the z-axis direction. The gate electrode 71 passes down through the N+ emitter region 3, the P-type base region 5, the N-type carrier stored layer 6, and the P-type buried layer 12 into the N-drift region 8. The split gate electrode 73 passes down through the P+ emitter region 4, the P-type base region 5, the N-type carrier stored layer 6, and the P-type buried layer 12 into the N-drift region 8. In addition, in this embodiment, the thickness of the split gate dielectric layer 74 is greater than or equal to the thickness of the gate dielectric layer 72 in the Y-axis direction, which can improve the breakdown voltage and reliability of the device in the blocking state.

Embodiment 2 of the present invention provides a three-dimensional carrier stored trench IGBT, its half cell structure and sections along AB line, CD line, EF line and GH line are shown in FIGS. 7-11. Wherein three-dimensional directions of the device are defined in a three-dimensional rectangular coordinate system as follows: the transverse direction of the device is defined as the X-axis direction, the vertical direction of the device is defined as the Y-axis direction, and the third dimensional direction, i.e., the direction perpendicular to both the X-axis and the Y-axis, is defined as the Z-axis direction. The cell structure of the device includes a back collector metal 11, a P-type collector region 10, an N-type field stop layer 9 and an N-drift region 8 stacked in an order from bottom to top in the Y-axis direction. A P-type buried layer 12 and a trench structure in side contact with each other along the X-axis direction provided at a top layer of the N-drift region 8. An N-type carrier stored layer 6 and a P-type base region 5 stacked in an order from bottom to top provided at a top layer of the P-type buried layer 12 in the Y-axis direction. N+ emitter regions 3 distributed at intervals provided at a top layer of the P-type base region 5 in the Z-axis direction. There is the P-type base region 5 between adjacent N+ emitter regions 3, and upper surfaces of the N+ emitter regions 3 and the P-type base region 5 is flush.

In the Y-axis direction, the depth of the trench structure is greater than a junction depth of the P-type buried layer 12. And the trench structure includes gate electrodes 71, gate dielectric layers 72, a split gate electrode 73, and a split gate dielectric layer 74. In the Z-axis direction, the gate electrodes 71 are distributed at intervals, and there is the split gate electrode 73 between the two adjacent gate electrodes 71. Moreover, along the Z-axis direction, the length of the gate electrode 71 is less than or equal to the length of the split gate electrode 73 between adjacent gate electrodes 71. In the Y-axis direction, the depth of a lower surface of the gate electrode 71 is greater than the junction depth of the P-type buried layer 12 and less than the depth of a lower surface of the split gate electrode 73. So the lower side of the gate electrode 71 has the split gate electrode 73, and the gate electrode 71 and the split gate electrode 73 are isolated by the gate dielectric layer 72. The gate electrode 71 is connected to the N+ emitter region 3, the P-type base region 5, the N-type carrier stored layer 6, the P-type buried layer 12 and the N-drift region 8 through the gate dielectric layer 72. The depth of a lower surface of the split gate electrode 73 is greater than the junction depth of the P-type buried layer 12. The split gate electrode 73 is connected to the P-type base region 5, the N-type carrier stored layer 6, the P-type buried layer 12 and the N-drift region 8 through the split gate dielectric layer 74. The split gate dielectric layer 74 has a thickness greater than or equal to the gate dielectric layer 72. And an emitter metal 1 is on the upper surfaces of the N+ emitter region 3 and a schottky contact metal 2 is on the P-type base region 5 between adjacent N+ emitter regions 3. And the split gate electrode 73 and the schottky contact metal 2 has the equal potential with the emitter metal 1.

The semiconductor material used in the above embodiment is silicon, and any suitable semiconductor material such as silicon carbide, gallium nitride and the like can also be used. In this embodiment, the metallized electrodes (emitter metal, collector metal, and Schottky contact metal) has the thickness of 1 to 6 µm; the N+ emitter region 3 has the doping concentration of $5 \times 10^{18}$ cm$^{-3}$ to $1 \times 10^{20}$ cm$^{-3}$ and the depth of 0.3 to 0.5 µm; the P-type base 5 has the doping concentration of $3 \times 10^{16}$ cm$^{-3}$ to $2 \times 10^{17}$ cm$^{-3}$ and the depth of 1 to 2.5 µm; the N-type carrier stored layer 6 has the doping concentration of $1 \times 10^{16}$ cm$^{-3}$ to $5 \times 10^{17}$ cm$^{-3}$ and the depth of 1 to 2.5 µm; the P-type buried layer 12 has the doping concentration of $1 \times 10^{16}$ cm$^{-3}$ to $5 \times 10^{18}$ cm$^{-3}$ and the depth of 0.5 to 1.5 µm; the N-type drift region 8 has the doping concentration of $2 \times 10^{14}$ cm$^{-3}$ to $1 \times 10^{16}$ cm$^{-3}$; the split gate dielectric layer 74 has the thickness of 0.2 to 3 µm; the gate dielectric layer 72 has the thickness of 200 to 1000 nm; the gate electrode has a depth of 3 to 5 µm; and the split gate electrode 73 has the depth of 5 to 7 µm. The gate electrode 71 has the length in the Z-axis direction of 0.5 to 2 µm; and the split gate electrode 73 located between two adjacent gate electrodes 71 has the length in the Z-axis direction of 0.5 to 5 µm.

In this embodiment, the trench structure can penetrate through the N+ emitter region 3, the P-type base region 5, the N-type carrier stored layer 6 and the P-type buried layer 12 from the surface of the device downward in sequence and then extend into the N-drift region 8, and the trench structure can penetrate through the device in the Z-axis direction. The gate electrode 71 passes down through the N+ emitter region 3, the P-type base region 5, the N-type carrier stored layer 6, and the P-type buried layer 12 into the N-drift region 8. And the split gate electrode 73 passes down through the P-type base region 5, the N-type carrier stored layer 6, and the P-type buried layer 12 into the N-drift region 8.

In this embodiment, a Schottky contact metal 2 having an equipotential with the emitter metal 1 is introduced on the upper surface of the P-type base region 5 between adjacent N+ emitter regions 3. The Schottky contact is formed between the Schottky contact metal 2 and the upper surface of the P-type base region 5, which can reduce the on-stage voltage drop of PMOS. So that PMOS can turn on faster, which can not only have better clamping effect when conducting forwardly, but also better improve the short-circuit safe operating area of the device. When the device is turned off, the switching speed of the device can be further improved and the switching loss of the device can be reduced. In addition, in this embodiment, the thickness of the split gate dielectric layer 74 is greater than or equal to the thickness of the gate dielectric layer 72, which can improve the breakdown voltage and reliability of the device in the blocking state.

Embodiment 3 of the present invention provides a three-dimensional carrier stored trench IGBT, its half cell structure and sections along AB line, CD line, EF line and GH line are shown in FIGS. 12-16. Embodiment 3 of the present invention is based on embodiment 1, where a floating P-type region 13 is formed by ion implantation. In the X-axis direction, the floating P-type region 13 is located at one side of the trench structure. The floating P-type region 13 is isolated from the gate electrode 71 by the gate dielectric layer 72 and from the split gate electrode 73 by the split gate dielectric layer 74.

In the above embodiment, the introduction of the floating P-type region 13 leads to an accumulation of holes on the surface when the device is turned on. Due to the principle of charge balance, the accumulated holes will induce a corresponding number of electrons, which greatly enhances the conductance modulation ability of the device and reduces the on-stage voltage drop and on-stage loss of the device.

Embodiment 4 of the present invention provides a three-dimensional carrier stored trench IGBT, its half cell structure and sections along AB line, CD line, EF line and GH line are shown in FIGS. 17-21. Embodiment 4 of the present invention is based on embodiment 3, where in the X-axis direction, the width of the gate electrode 71 plus the width of the gate dielectric layer 72 is smaller than the width of the trench structure, and the split gate electrode 73 is provided between the gate dielectric layer 72 and the floating P-type region 13. The split gate electrode 73 is connected to the floating P-type region 13 through the split gate dielectric layer 74.

In this embodiment, when the gate trench etching is performed, the split gate electrode 73 is formed in an "L" shape in the X-axis direction by partially etching the polysilicon and the dielectric layers filled in the split gate trench. So that the split gate electrode 73 can wrap around the gate electrode 71.

According to this embodiment, the width of the gate electrode 71 in the X-axis direction is reduced by adjusting the size of the aperture of the mask during the etching, thereby changing the shape of the split gate electrode 73. By shielding the coupling effect between the gate electrode 71 and the floating P-type region 13 by the split gate electrode 73, the negative capacitance effect caused by the displacement current of the floating P-type region is reduced, so that the gate-collector capacitance can be reduced and the switching speed of the device can be improved. And reducing the displacement current can improve the gate control ability and reduce EMI noise.

Embodiment 5 of the present invention provides a three-dimensional carrier stored trench IGBT, the half cell structure and sections along AB line and CD line are respectively shown in FIGS. 22-24. Embodiment 5 of the present invention is based on embodiment 4, where the N-drift region 8 has a super junction P-pillar 14 and a super junction N-pillar 15 in side contact with each other along the X-axis direction. And the super junction P-pillar 14 and the super junction N-pillar 15 meet charge balance requirements. A first part of the trench structure and the P-type buried layer 12 are located on the super junction N-pillar 15, and the other part of the trench structure and the floating P-type region 13 are located on the super junction P-pillar 14.

In the above embodiment, the super junction N-pillar 15 has a doping concentration greater than or equal to the N-drift region 8. In this embodiment, the one-dimensional withstand voltage in the drift region is changed into the two-dimensional withstand voltage by introducing the super junction P-pillar 14 and the super junction N-pillar 15 in the drift region 8, thereby improving the trade-off relationship between the on-state voltage drop and the breakdown voltage and improving the device performance.

Optionally, the depth of the lower surface of the floating P-type region 13 is equal to or greater than the depth of the trench structure.

Optionally, the doping concentration of the N-type carrier stored layer 6 varies gradually from the region close to the trench structure to the region away from the trench structure, wherein the doping concentration is low in the region close to the trench structure and high in the region away from the trench structure.

In the above embodiment, the doping concentration of the N-type carrier stored layer 6 close to the trench region is reduced, so the threshold voltage of the PMOS can be reduced and the PMOS can be turned on faster. Therefore, a better clamping effect when conducting forwardly can be achieved, so as to better improve the short-circuit safe operating area of the device. And when the device is turned off, the switching speed of the device can be further improved and the switching loss of the device can be reduced. In the case of forward conduction, the gate electrode is connected to high potential, and an electron accumulation layer will be formed at the N-type carrier stored layer close to the gate electrode, so the forward conduction characteristics of the device will not be affected.

Optionally, the gradual change of the doping concentration of the N-type carrier stored layer 6 is achieved by adopting the variable doping technique or the partition doping technique.

Optionally, the bottom of the trench structure is further provided with a P-type layer 16.

In the above embodiment, the junction depth of the P-type layer 16 is 0.5 to 1 μm.

In this embodiment, the P-type layer 16 is located at the bottom of the trench structure, and the P-type layer 16 and the split gate electrode 73 are connected through the split gate dielectric layer 74. By introducing the P-type layer 16 at the bottom of the trench structure, it is helpful to improve the electric field concentration at the bottom of the trench, and improve the breakdown voltage and reliability of the device.

Optionally, the semiconductor material used by the device is any one or more of Si, SiC, GaAs, GaN, $Ga_2O_3$, MN and diamond.

Optionally, the device structure is not only suitable for IGBT devices, but also suitable for MOSFET devices by replacing the P-type collector region 10 on the back side of the device with the N-type doping.

Embodiment 6 of the present invention is an illustration of the three-dimensional carrier stored trench IGBT at a voltage level of 1200 V. And devices with different performance parameters can be prepared as needed according to the common knowledge in the art.

Figure 33:
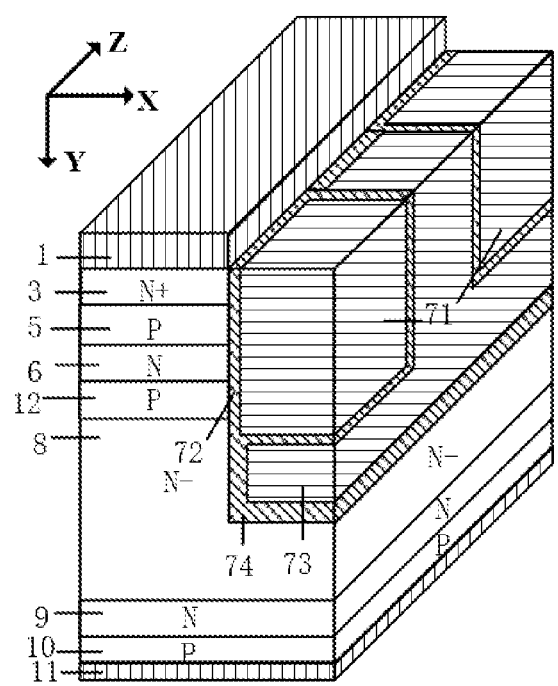
FIG. 33 is a half cell structure diagram of a three-dimensional carrier stored trench IGBT provided in embodiment 6 of the present invention after all the procedures are completed.

Embodiment 6 of the present invention provides a manufacturing method of the three-dimensional carrier stored trench IGBT, the method includes:

step 1: selecting a lightly doped FZ (Float Zone) silicon wafer having a thickness of 200 to 300 μm to form an N-drift region 8 of the device, the N-drift region having a doping concentration of $10^{14}$ to $10^{15}/cm^3$;

step 2: growing a layer of field oxide layer on the surface of the FZ silicon wafer, resulting in an active region by photoetching, then growing a layer of pre-oxide layer, making a P-type buried layer 12 by ion implantation of P-type impurities above the N-drift region 8, the P-type buried layer 12 having a doping concentration of $10^{15}$ to $10^{16}/cm^3$; making an N-type carrier stored layer 6 by ion implantation of N-type impurities on the upper surface of the P-type buried layer 12, the N-type carrier stored layer 6 having a doping concentration of $10^{15}$ to $10^{17}/cm^3$; and making a P-type base region 5 by ion implantation of the P-type impurities on the upper surface of the N-type carrier stored layer 6 and an annealing treatment, the P-type base region 5 having a doping concentration of $10^{16}$ to $10^{17}/cm^3$;

step 3: depositing a protective layer on the surface of the silicon wafer, photoetching a window to carry out trench silicon etching, thereby etching and forming a split gate trench on one side of the top layer of the N-drift region 8 in the X-axis direction, wherein the depth of the split gate trench is greater than the junction depth of the P-type buried layer 12, as shown in FIG. 25;

step 4: forming split dielectric layers 74 on the bottom and side walls of the split gate trench in the 02 atmosphere at the temperature of 1050° C. to 1150° C., as shown in FIG. 26, the split gate dielectric layer 74 having a thickness of 0.1 to 0.5 μm, and then depositing polysilicon on the split gate dielectric layers 74 at a temperature of 750° C. to 950° C., then reverse etching off excess polysilicon on the surface to form the split gate electrode 73, as shown in FIG. 27;

step 5: depositing the protective layer on the surface of the silicon chip, photoetching a window, and etching part of the polysilicon and the split gate dielectric layer in the Z-axis direction, so as to form gate trenches distributed at intervals in the Z-axis direction, wherein the split gate electrodes 73 are provided between the two adjacent gate trenches. The depths of the gate trenches are greater than the junction depth of the P-type buried layer 12 and smaller than depths of the split gate electrodes 73 in the Y-axis direction, as shown in FIG. 28;

step 6: forming gate dielectric layers 72 on the bottom and side walls of the gate trench, as shown in FIG. 29, the gate dielectric layer 72 having a thickness of 0.1 to 0.3 μm, depositing polysilicon on the gate dielectric layers 72 to form gate electrodes 71, wherein the gate electrodes 71 are isolated from the split gate electrode 73 by the gate dielectric layers 72, and the thickness of each of the gate dielectric layer 72 is less than or equal to the thickness of each of the split gate dielectric layer 74, as shown in FIG. 30;

step 7: implanting the N-type impurities and the P-type impurities on the top layer of the P-type base region 5 through photoetching and ion implantation processes, respectively, so as to form N+ emitter regions 3 and a P+ emitter region 4 which are alternately arranged side by side and contact with each other on the top layer of the P-type base region 5 in the Z-axis direction, as shown in FIG. 31; wherein in the X-axis direction, one side of the N+ emitter region 3 is connected to the gate electrode 71 through the gate dielectric layer 72, and one side of the P+ emitter region 4 is connected to the split gate electrode 73 through the split gate dielectric layer 74, the N+ emitter region 3 has a depth junction of 0.2 to 0.5 μm and a doping concentration of $10^{18}$ to $10^{19}/cm^3$, the P+ emitter region 4 has a depth junction of 0.2 to 0.5 μm and a doping concentration of $10^{18}$ to $10^{19}/cm^3$;

step 8: depositing a metal having a thickness of 1 to 6 μm on the surface of the device, and forming an emitter metal 1 on the N+ emitter region 3 and the P+ emitter region 4 by using photoetching and etching processes, as shown in FIG. 32;

step 9: flipping the silicon wafer, reducing the thickness of the silicon wafer, making an N-type field stop layer 9 of the device through implanting the N-type impurities into the back surface of the silicon wafer and performing multiple laser annealing, wherein the formed N-type field stop layer has a thickness of 1 to 5 an ion implantation energy of 40 to 1000 keV and an implantation dose of $10^{13}$ to $10^{14}/cm^2$;

step 10: forming a P-type collector region 10 by implanting the P-type impurities on the back surface of the N-type field stop layer 9, the formed P-type collector region 10 having a thickness of 0.5 to 2 an ion implantation energy of 30 to 100 keV and an implantation dose of $10^{13}$ to $10^{14}/cm^2$, and performing ion activation through multiple laser annealing; then depositing a metal having a thickness of 1 to 6 μm on the back surface of the P-type collector region to form a collector metal 11, as shown in FIG. 33. So far, the preparation of the three-dimensional trench charge storage IGBT has been completed.

Optionally, the order of forming the trench structure and forming the P-type buried layer 12, the N-type carrier stored layer 6, the P-type base region 5 is interchangeable.

Optionally, the semiconductor material used in the device is any one or more of Si, SiC, GaAs, GaN, $Ga_2O_3$, AlN and diamond, and each structure can be made of the same semiconductor material or a combination of different semiconductor materials.

By introducing the P-type buried layer for shielding the electric field of the N-type carrier stored layer and the split gate electrode with equal potential to the emitter metal, the effect of doping concentration of the N-type carrier stored layer on the breakdown characteristics of the device is eliminated, and the thick split gate dielectric layer at the bottom of the trench can alleviate the electric field concentration and reduce the electric field peak at the corner, thereby improving the breakdown voltage and reliability of the device. Therefore, the concentration of N-type carrier stored layer can be further increased to improve the carrier distribution during forward conduction of the device, and the trade-off relationship between the forward on-state voltage drop Vceon and the turn-off loss Eoff can be improved.

In addition, the gate electrode and the split gate electrode are located in the same trench, and the gate electrode and the split gate electrode are arranged at intervals in the Z-axis direction. This can effectively reduce the channel density of the whole chip, and a parasitic PMOS structure can be formed by the split gate electrode between two adjacent gate electrodes, the P-type base region, the P+ emitter region, the N-type carrier stored layer and the P-type buried layer. When conducting forwardly, the potential of the P-type buried layer and the N-type carrier stored layer increases with an increase in the forward bias applied to the collector. However, when the potential of the P-type buried layer increases to a certain value, PMOS will be turned on, the P-type buried layer and the N-type carrier stored layer are equivalent to being connected to the emitter and their potential will no longer increase with the increase of the collector voltage. So that part of the gate-collector capacitance can be converted into the gate-emitter capacitance, and the gate-collector capacitance can be effectively reduced. At the same time, the gate electrode is enclosed by the split gate electrode, which largely suppresses the coupling between the gate electrode and the drift region. The gate capacitance, especially the gate-collector capacitance, is reduced, and the switching speed of the device is improved, and the turn-off loss is reduced. The gate charge of the device can also be reduced while the gate capacitance is reduced, which makes the devices easy to be driven, reduces the requirements of driving ability and reduces the driving loss. Under short-circuit conditions, the reduced channel density and the channel potential being clamped result in the lower saturation current density of the device, thereby resulting in the wide short-circuit safe operating area (SCSOA). In addition, since the gate electrode and the split gate electrode are located in the same trench, the distance between the parasitic PMOS and the NMOS channel is reduced. So the clamping effect of the PMOS is improved, and the current uniformity inside the chip can be improved, thereby improving the reliability and reverse bias safe operating area (RBSOA) of the device.

In the description of the present invention, it should be understood that orientation or positional relationships indicated by terms such as "center", "longitudinal", "transverse", "length", "width", "thickness", "up", "down", "front", "back", "left", "right", "vertical", "horizontal", "top", "bottom", "inner", "outer", "clockwise", "counterclockwise", "axial", "radial", "circumferential", etc. are based on the orientation or positional relationships shown in the drawings, for ease of description of the present invention and simplification of the description only, these terms do not indicate or imply that the apparatus or element referred to must have a specific orientation or be constructed and operated in a specific orientation, and therefore cannot be construed as limitations to the present invention.

In the present invention, the terms "install", "connect", "couple", "fix" and the like are to be understood in a broad sense, unless otherwise expressly specified and limited, for example, it can be a fixed connection, may also be a detachable connection, or be integral; it can be a mechanical connection, can also be an electrical connection; it can be directly connected, or indirectly connected through an intermediate medium, or it can be an internal connection of two elements or an interactive relationship of two elements, unless otherwise clearly defined. For those ordinarily skilled in the art, the specific meanings of the above terms in the present invention will be understood according to the specific circumstances.

In the present invention, the first feature "above" or "below" the second feature may be a direct contact between the first and second features, or an indirect contact between the first and second features via an intermediate medium, unless otherwise expressly specified and defined. Moreover, the first feature is "over", "above" and "on" the second feature may indicate that the first feature directly above or obliquely above the second feature, or simply indicates that a horizontal height of the first feature is higher than that of the second feature. The first feature is "under", "underneath" and "below" the second feature may indicate that the first feature is directly below or obliquely below the second feature, or simply indicates that the horizontal height of the first feature is less than that of the second feature.

In the description of the description, illustrations of the reference terms "one embodiment," "some embodiments," "example," "specific example," or "some examples," etc. mean that specific features, structures, materials, or features described in connection with the embodiment or example are encompassed in at least one embodiment or example of the present invention. In this description, the schematic formulation of the above terms need not be directed to the same embodiments or examples. Further, the specific features, structures, materials or characteristics described may be combined in a suitable manner in any one or more embodiments or examples. Further, without contradicting one another, those skilled in the art may connect and combine different embodiments or examples described in this description and features of different embodiments or examples.

The above are merely the better embodiments of the present invention and are not intended to limit the present invention, any modification, equivalent replacement, improvement, etc. made within the spirit and principles of the present invention should be included in the scope of protection of the present invention.

What is claimed is:

1. A three-dimensional carrier stored trench insulated gate bipolar transistor (IGBT), wherein three-dimensional directions of the three-dimensional carrier stored trench IGBT are defined in a three-dimensional rectangular coordinate system as follows: a transverse direction of the three-dimensional carrier stored trench IGBT is defined as an X-axis direction, a vertical direction of the three-dimensional carrier stored trench IGBT is defined as a Y-axis direction, and a third dimensional direction, which is a direction perpendicular to both the X-axis direction and the Y-axis direction, is defined as a Z-axis direction, wherein a cell structure of the three-dimensional carrier stored trench IGBT comprises a back collector metal, a P-type collector region, an N-type field stop layer and an N-drift region stacked in an order from bottom to top in the Y-axis direction; a P-type buried layer and a trench structure in side contact with each other along the X-axis direction provided at a top layer of the N-drift region; an N-type carrier stored layer and a P-type base region stacked in an order from bottom to top provided at a top layer of the P-type buried layer in the Y-axis direction; an N+ emitter region and a P+ emitter region in side contact with each other along the Z-axis direction provided at a top layer of the P-type base region, and the N+ emitter region and the P+ emitter region distributed alternately;

a depth of the trench structure is greater than a junction depth of the P-type buried layer in the Y-axis direction, and the trench structure includes a plurality of gate electrodes, gate dielectric layers, a split gate electrode, and a split gate dielectric layer; in the Z-axis direction, the plurality of gate electrodes are distributed at intervals, and the split gate electrode is arranged between two adjacent gate electrodes of the plurality of gate electrodes; along the Z-axis direction, a length of a given gate electrode of the plurality of gate electrodes is less than or equal to a length of the split gate electrode between the two adjacent gate electrodes; in the Y-axis direction, a depth of the given gate electrode is greater than the junction depth of the P-type buried layer and less than a depth of a lower surface of the split gate electrode; a lower side of the given gate electrode has the split gate electrode, and the given gate electrode and the split gate electrode are isolated by the gate dielectric layer; the given gate electrode is connected to the N+ emitter region, the P-type base region, the N-type carrier stored layer, the P-type buried layer and the N-drift region through the gate dielectric layer; the depth of the lower surface of the split gate electrode is greater than the junction depth of the P-type buried layer; the split gate electrode is connected to the P+ emitter region, the P-type base region, the N-type carrier stored layer, the P-type buried layer and the N-drift region through the split gate dielectric layer; the split gate dielectric layer has a thickness greater than or equal to the gate dielectric layer; an emitter metal is on upper surfaces of the N+ emitter region and the P+ emitter region, and the split gate electrode has an equal potential with the emitter metal.

2. The three-dimensional carrier stored trench IGBT according to claim 1, further comprising a floating P-type region; wherein in the X-axis direction, the floating P-type region is located at one side of the trench structure, the floating P-type region is isolated from the given gate electrode by the gate dielectric layer and from the split gate electrode by the split gate dielectric layer.

3. The three-dimensional carrier stored trench IGBT according to claim 2, wherein in the X-axis direction, a width of the given gate electrode plus the gate dielectric layer is smaller than a width of the trench structure, the split gate electrode is provided between the gate dielectric layer and the floating P-type region, and the split gate electrode is connected to the floating P-type region through the split gate dielectric layer.

4. The three-dimensional carrier stored trench IGBT according to claim 3, wherein the N-drift region has a super junction P-pillar and a super junction N-pillar in side contact with each other along the X-axis direction; the super junction P-pillar and the super junction N-pillar meet charge balance requirements, a part of the trench structure and the P-type buried layer are located on the super junction N-pillar, and the other part of the trench structure and the floating P-type region are located on the super junction P-pillar.

5. The three-dimensional carrier stored trench IGBT according to claim 1, wherein a doping concentration of the N-type carrier stored layer varies gradually from a first region close to the trench structure to a second region away from the trench structure, wherein the doping concentration is low in the first region close to the trench structure and high in the second region away from the trench structure.

6. The three-dimensional carrier stored trench IGBT according to claim 1, wherein a bottom of the trench structure is further provided with a P-type layer.

7. The three-dimensional carrier stored trench IGBT according to claim 1, wherein a semiconductor material used by the three-dimensional carrier stored trench IGBT is any one or more selected the group consisting of Si, SiC, GaAs, GaN, $Ga_2O_3$, AlN and diamond.

8. A manufacturing method of a three-dimensional carrier stored trench insulated gate bipolar transistor (IGBT), comprising:
step 1: selecting a lightly doped float zone (FZ) silicon wafer to form an N-drift region of the three-dimensional carrier stored trench IGBT;
step 2: growing a layer of field oxide layer on a surface of the FZ silicon wafer, resulting in an active region by photoetching, then growing a layer of pre-oxide layer, making a P-type buried layer by ion implantation of P-type impurities above the N-drift region; making an N-type carrier stored layer by ion implantation of N-type impurities on an upper surface of the P-type buried layer; and making a P-type base region by ion implantation of the P-type impurities on an upper surface of the N-type carrier stored layer and an annealing treatment;
step 3: depositing a protective layer on a surface of the silicon chip, photoetching a window to carry out trench silicon etching, thereby etching and forming a split gate trench on one side of a top layer of the N-drift region in an X-axis direction, wherein a depth of the split gate trench is greater than a junction depth of the P-type buried layer;
step 4: forming split gate dielectric layers on a bottom and side walls of the split gate trench, and then depositing polysilicon on the split gate dielectric layers to form split gate electrodes;
step 5: depositing the protective layer on a surface of the silicon wafer, photoetching a window, and etching part of the polysilicon and the split gate dielectric layer, so as to form gate trenches distributed at intervals on top layers of the split gate trenches in a Z-axis direction, wherein the split gate electrodes are provided between the gate trenches, and depths of the gate trenches are greater than the junction depth of the P-type buried layer;
step 6: forming gate dielectric layers on a bottom and side walls of the gate trench, depositing polysilicon on the gate dielectric layers to form a plurality of gate electrodes, wherein the plurality of gate electrodes are isolated from the split gate electrodes by the gate dielectric layers, and a thickness of each of the gate dielectric layers is less than or equal to a thickness of each of the split gate dielectric layers;
step 7: implanting the N-type impurities and the P-type impurities on a top layer of the P-type base region through photoetching and ion implantation processes, respectively, so as to form an N+ emitter region and a P+ emitter region which are alternately arranged side by side and contact with each other on the top layer of the P-type base region in the Z-axis direction;
wherein in the X-axis direction, one side of the N+ emitter region is connected to a given gate electrode of the plurality of gate electrodes through the gate dielectric layer, and one side of the P+ emitter region is connected to a given split gate electrode of the split gate electrodes through a given split gate dielectric layer of the split gate dielectric layer;
step 8: depositing a metal on a surface of the three-dimensional carrier stored trench IGBT, and forming an emitter metal on the N+ emitter region and the P+ emitter region by using photoetching and etching processes;
step 9: flipping the silicon wafer, reducing a thickness of the silicon wafer, making an N-type field stop layer of the three-dimensional carrier stored trench IGBT through implanting the N-type impurities into a back surface of the silicon wafer and performing multiple laser annealing;
step 10: forming a P-type collector region by implanting the P-type impurities on a back surface of the N-type field stop layer, and performing ion activation through multiple laser annealing; then depositing a metal on a back surface of the P-type collector region to form a collector metal,
wherein, in the three-dimensional carrier stored trench IGBT manufactured by the manufacturing method,
three-dimensional directions of the three-dimensional carrier stored trench IGBT are defined in a three-dimensional rectangular coordinate system as follows: a transverse direction of the three-dimensional carrier stored trench IGBT is defined as the X-axis direction, a vertical direction of the three-dimensional carrier stored trench IGBT is defined as a Y-axis direction, and a third dimensional direction, which is a direction perpendicular to both the X-axis direction and the Y-axis direction, is defined as the Z-axis direction, wherein a cell structure of the three-dimensional carrier stored trench IGBT comprises a back collector metal, the P-type collector region, the N-type field stop layer and the N-drift region stacked in an order from bottom to top in the Y-axis direction; the P-type buried layer and a trench structure in side contact with each other along the X-axis direction provided at the top layer of the N-drift region; the N-type carrier stored layer and the P-type base region stacked in an order from bottom to top provided at a top layer of the P-type buried layer in the Y-axis direction; the N+ emitter region and the P+ emitter region in side contact with each other along the Z-axis direction provided at the top layer of the P-type base region, and the N+ emitter region and the P+ emitter region distributed alternately:
a depth of the trench structure is greater than the junction depth of the P-type buried layer in the Y-axis direction, and the trench structure includes the plurality of gate electrodes, the gate dielectric layers, the given split gate electrode, and the given split gate dielectric layer; in the Z-axis direction, the plurality of gate electrodes are distributed at intervals, and the given split gate electrode is arranged between two adjacent gate electrodes of the plurality of gate electrodes; along the Z-axis direction, a length of the given gate electrode is less than or equal to a length of the given split gate electrode between the two adjacent gate electrodes; in the Y-axis direction, a depth of the given gate electrode is greater than the junction depth of the P-type buried layer and less than a depth of a lower surface of the given split gate electrode; a lower side of the given gate electrode has the given split gate electrode, and the given gate electrode and the given split gate electrode are isolated by a given gate dielectric layer of the gate dielectric layers; the given gate electrode is connected to the N+ emitter region, the P-type base region, the N-type carrier stored layer, the P-type buried layer and the N-drift region through the given gate dielectric layer; the depth of the lower surface of the given split gate electrode is greater than the junction depth of the P-type buried layer; the given split gate electrode is connected to the P+ emitter region, the P-type base region, the N-type carrier stored layer, the P-type buried layer and the N-drift region through the given split gate dielectric layer; the given split gate dielectric layer has a thickness greater than or equal to the given gate dielectric layer; the emitter metal is on upper surfaces of the N+ emitter region and the P+ emitter region, and the given split gate electrode has an equal potential with the emitter metal.

9. The manufacturing method of the three-dimensional carrier stored trench IGBT according to claim 8, wherein a doping concentration of the N-drift region is $10^{14}$ to $10^{15}/cm^3$, or a doping concentration of the P-type buried layer is $10^{15}$ to $10^{16}/cm^3$, or a doping concentration of the N-type carrier stored layer is $10^{15}$ to $10^{17}/cm^3$, or a doping concentration of the P-type base region is $10^{16}$ to $10^{17}/cm^3$.

* * * * *